United States Patent
Kwon et al.

(10) Patent No.: US 7,811,726 B2
(45) Date of Patent: *Oct. 12, 2010

(54) PHOTORESIST COMPOSITION AND METHOD OF MANUFACTURING A COLOR FILTER SUBSTRATE BY USING THE SAME

(75) Inventors: Se-Ah Kwon, Seoul (KR); Chul Huh, Suwon-si (KR); Jin-Seuk Kim, Daejeon (KR); Byoung-Joo Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/569,857

(22) Filed: Sep. 29, 2009

(65) Prior Publication Data

US 2010/0021832 A1    Jan. 28, 2010

Related U.S. Application Data

(63) Continuation of application No. 11/821,411, filed on Jun. 22, 2007, now Pat. No. 7,615,322.

(30) Foreign Application Priority Data

Jul. 5, 2006    (KR) ............... 10-2006-0062860

(51) Int. Cl.
*G03F 7/004* (2006.01)
(52) U.S. Cl. .............. 430/7; 430/270.1; 430/281.1; 430/288.1
(58) Field of Classification Search .............. 430/7, 430/270.1, 281.1, 288.1
See application file for complete search history.

(56) References Cited

U.S. PATENT DOCUMENTS

| 5,968,688 | A | 10/1999 | Masuda et al. |
| 6,509,125 | B1 | 1/2003 | Ito et al. |
| 7,615,322 | B2 * | 11/2009 | Kwon et al. ............ 430/7 |
| 2006/0257763 | A1 | 11/2006 | Araki |

* cited by examiner

*Primary Examiner*—John S Chu
(74) *Attorney, Agent, or Firm*—Innovation Counsel LLP

(57) ABSTRACT

A photoresist composition includes a coloring agent, a binder resin, a cross-linker, a photo-polymerization initiator and a solvent. The coloring agent includes an anthraquinone-based dye and a pigment. A color filter formed from the photoresist composition has a relatively greater light-transmittance. Thus, a contrast of a display apparatus having the color filter may be improved.

19 Claims, 2 Drawing Sheets

PHOTORESIST COMPOSITION AND METHOD OF MANUFACTURING A COLOR FILTER SUBSTRATE BY USING THE SAME

CROSS-REFERENCE TO RELATED APPLICATIONS

This application is a continuation application of U.S. patent application Ser. No. 11/821,411 filed on Jun. 22, 2007, which claims priority to Korean Patent Application No. 2006-62860 filed on Jul. 5, 2006, the contents of which are herein incorporated by reference in their entirety.

BACKGROUND OF THE INVENTION

1. Field of the Invention

The present invention relates to a photoresist composition and a method of manufacturing a color filter substrate by using the photoresist composition. More particularly, the present invention relates to a photoresist composition capable of improving a contrast of a display apparatus and a method of manufacturing a color filter substrate by using the photoresist composition.

2. Description of the Related Art

In general, a liquid crystal display (LCD) apparatus displays an image by using optical and electrical properties of the liquid crystal, such as an anisotropic refractive index, an anisotropic dielectric constant, etc. The LCD apparatus has characteristics, for example, such as a light weight, lower power consumption, lower driving voltage, etc., in comparison with a display apparatus such as a cathode ray tube, a plasma display panel, and so on.

The LCD apparatus includes a liquid crystal layer interposed between glass substrates. Light generated by a light source passes through the liquid crystal layer, and the liquid crystal layer controls a transmittance of the light. The light having passed through the liquid crystal layer passes a color filter layer. A full color is displayed using an additive mixture of the light or a subtractive mixture of the light.

In general, the color filter layer includes a binder resin and a pigment. For example, when the color filter layer has a red color filter, a green color filter, and a blue color filter, the red, green and blue color filters respectively includes a red pigment, a green pigment, and a blue pigment. The color filter layer may further include a yellow pigment, a violet pigment, etc, to effectively display a color. Since a size of the pigment is relatively large, the pigment scatters the light passing through the color filter layer. Thus, the brightness and a contrast of the LCD apparatus are reduced.

SUMMARY

The present invention provides a photoresist resin composition capable of improving a contrast of a display apparatus.

The present invention also provides a method of manufacturing a color filter substrate by using the above-mentioned photoresist resin composition.

In one aspect of the present invention, a photoresist composition includes a coloring agent, a binder resin, a cross-linker, a photo-polymerization initiator and a solvent. The coloring agent includes an anthraquinone-based dye and a pigment.

The anthraquinone-based dye may include a compound represented by the following Chemical Formula (1):

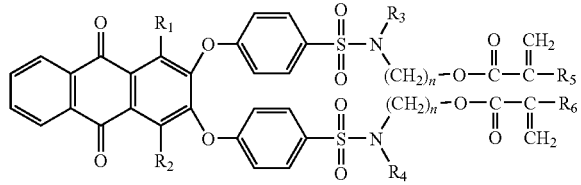

wherein $R_1$ and $R_2$ independently represent one selected from the group consisting of an amine group, a hydroxyl group and a halogen atom, and $R_3$, $R_4$, $R_5$ and $R_6$ independently represent an alkyl group having 1 to 4 carbon atoms, and n is a natural number.

Particularly, the anthraquinone-based dye may include a compound represented by the following Chemical Formula (2):

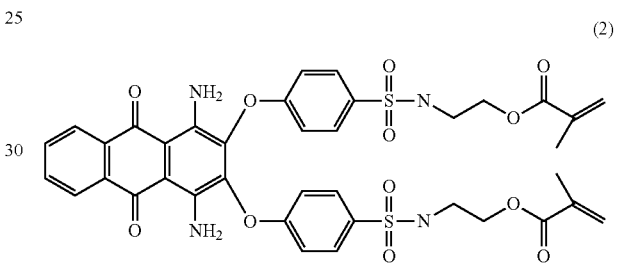

A content of the coloring agent may be about 10% to about 60% by weight based on the total weight of the photoresist composition. A content of the anthraquinone-based dye may be about 5% to about 50% by weight based on a total weight of the coloring agent. Furthermore, the anthraquinone-based dye may have a maximum ultraviolet (UV) ray absorbance in a range between about 525 nm and about 535 nm.

For example, the binder resin may include at least one selected from the group consisting of a phenol-based polymer and an acryl-based polymer. The pigment may include an organic pigment.

The photoresist composition may further include an additive including at least one selected from the group consisting of a surfactant, a pigment-dispersing agent and an adhesive. A content of the additive may be about 1% to about 3% by weight based on the total weight of the photoresist composition.

In another aspect of the present invention, there is provided a method of manufacturing a color filter substrate. In the method, a light-blocking layer is formed on a base substrate. A photoresist composition is coated on the base substrate to form a photoresist film. The photoresist composition includes a binder resin, a cross-linker, a photo-polymerization initiator, a solvent and a coloring agent having an anthraquinone-based dye and a pigment. The photoresist film is selectively exposed to light. The photoresist film exposed to the light is developed to form a color filter pattern.

According to the above, a color filter formed from the photoresist composition has a relatively great light-transmittance. Thus, a contrast of a display apparatus having the color filter may be improved.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION

Figure 1:
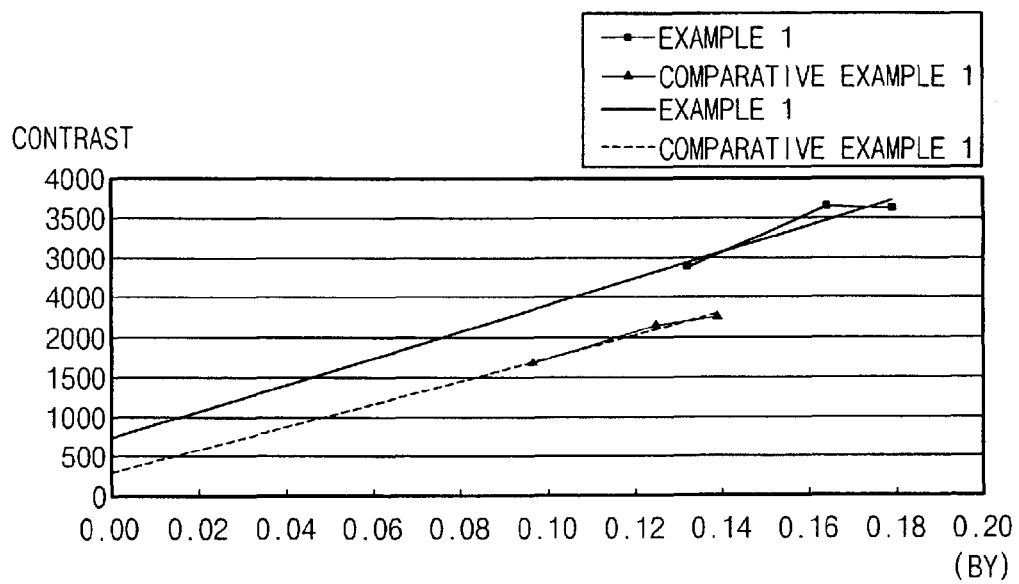
FIG. 1 is a graph showing a contrast of each photoresist film formed from photoresist compositions of Example 1 and Comparative Example 1.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will convey the scope of the invention to those skilled in the art. In the drawings, the sizes and relative sizes of layers and regions may be exaggerated for clarity.

It will be understood that when a member or layer is referred to as being "on," "connected to" or "coupled to" another member or layer, it can be directly on, connected or coupled to the other member or layer or intervening members or layers may be present. In contrast, when a member is referred to as being "directly on," "directly connected to" or "directly coupled to" another member or layer, there are no intervening members or layers present. Like numbers refer to like members throughout. As used herein, the term "and/or" includes any and all combinations of one or more of the associated listed items.

It will be understood that, although the terms first, second, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the present invention.

Spatially relative terms, such as "beneath," "below," "lower," "above," "upper" and the like, may be used herein for ease of description to describe one member or feature's relationship to another member(s) or feature(s) as illustrated in the figures. It will be understood that the spatially relative terms are intended to encompass different orientations of the device in use or operation in addition to the orientation depicted in the figures. For example, if the device in the figures is turned over, members described as "below" or "beneath" other members or features would then be oriented "above" the other members or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, members, and/or components, but do not preclude the presence or addition of one or more other features, integers, steps, operations, members, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Composition

In accordance with an embodiment of the present invention, a photoresist composition includes a coloring agent, a binder resin, a cross-linker, a photo-polymerization initiator and a solvent. The coloring agent includes an anthraquinone-based dye and a pigment.

The binder resin may include a hydroxyl aromatic polymer that is soluble in an alkaline solution such as an alkaline developing solution and is not soluble in water.

The binder resin may be cross-linked with each other by the cross-linker. The binder resin is soluble in the alkaline solution before the binder resin is cross-linked to each other. However, the binder resin is not soluble in the alkaline solution after the binder resin is cross-linked with each other.

Examples of the binder resin may include a phenol-based polymer, an acryl-based polymer, etc. The phenol-based polymer may be synthesized by polymerizing aldehyde-based compound and phenol-based compound. Examples of the phenol-based compound may include ortho-cresol, meta-cresol, 2,4-xylenol, 2,5-xylenol, 3,4-xylenol, novolak derived therefrom, etc. These can be used alone or in a mixture thereof. Particularly, examples of the binder resin may include poly(vinyl phenol) such as poly(para-hydroxystyrene), poly(para-hydroxy-α-methylstyrene), etc., a copolymer polymerized from para-hydroxystyrene, para-hydroxy-α-methylstyrene, acetoxystyrene, acrylic acid, methacrylic acid, etc., hydroxyphenyl carbonyl copolymer, novolak/poly (vinyl phenol) copolymer, etc. These can be used alone or in a mixture thereof.

For example, a content of the binder resin may be about 5% to about 40% by weight based on a total weight of the photoresist composition. When the content of the binder resin is less than about 5% by weight, a photoresist film formed from the photoresist composition may have a relatively low stability of shape. When the content of the binder resin is more than about 40% by weight, the thickness of the photoresist film formed from the photoresist composition may not be uniform.

The cross-linker may include an oligomer capable of cross-linking the binder resin with each other. The binder resin in an exposed area is cross-linked with each other to be insoluble in an alkaline solution. Thus, a photoresist film may be patterned to form a photoresist pattern.

Examples of the cross-linker may include an aminoplast and an amine compound, such as urea, melamine, glycol urea, etc. Particularly, examples of the cross-linker may include urea-formaldehyde oligomer, melamine-formaldehyde oligomer, benzoguanamine-formaldehyde oligomer, glycoluril-formaldehyde oligomer, hexa(methoxymethyl)melamine oligomer, etc. Among the above, hexa(methoxymethyl) melamine oligomer may be preferable.

For example, a content of the cross-linker may be about 1% to about 15% by weight based on the total weight of the photoresist composition. When the content of the cross-linker is less than about 1% by weight, the polymerization degree of the photoresist film formed from the photoresist composition may be relatively low. When the content of the cross-linker is more than about 15% by weight, a manufacturing cost may increase.

The photo-polymerization initiator may initiate polymerization of the cross-linker when exposed to light.

Examples of the photo-polymerization initiator may include a triazine-based compound, an acetophenone-based compound, a xanthone-based compound, a benzoin-based compound and an imidazole-based compound.

Examples of the triazine-based compound may include 2,4-bis(trichloromethyl)-6-p-methoxystyril-s-triazine, 2-p-methoxystyril-4,6-bis-trichloromethyl-s-triazine, 2,4-trichloromethyl-6-triazine, 2-(2-bromo-4-methylphenyl)-4,6-bis(trichloromethyl)-s-triazine, etc. When the triazine-based compound is exposed to light, a halogen gas may be generated to damage, for example, a mask, and to deteriorate a light-transmittance of the photoresist film formed from the photoresist composition. Thus, a content of the triazine-based compound may be preferably less than about 1% by weight based on the total weight of the photoresist composition.

Examples of the acetophenone-based compound may include benzophenone, p-(dimethylamino)benzophenone, 2,2-dichloro-4-phenoxyacetophenone, 4,4-bis(dimethylamino)benzophenone, 2,2-diethoxyacetophenone, 2,2-dibutoxyacetophenone, 2-hydroxy-2-methylproliophenone, p-t-butyltrichloroacetophenone, etc. Furthermore, examples of the xanthone-based compound may include xanthone, thioxanthone, 2-methyl thioxanthone, 2-isobutylthioxanthone, 2-dodecylthioxanthone, 2,4-dimethylthioxanthone, etc.

Examples of the benzoin-based compound may include benzoin, benzoin ethyl ether, benzoin methyl ether, benzoin propyl ether, t-butyl benzoyl ether, etc.

Examples of the imidazole-based compound may include 2,2-bis-2-chlorophenyl-4,5,4,5-tetraphenyl-2-1,2-biimidazole, 2,2-bis(2,4,6-tricyanophenyl)-4,4,5,5-tetraphenyl-1,2-biimidazole, etc.

For example, a content of the photo-polymerization initiator may be about 0.5% to about 5% by weight based on the total weight of the photoresist composition. When the content of the photo-polymerization initiator is less than about 0.5% by weight, the polymerization degree of the photoresist film formed from the photoresist composition may be relatively low. When the content of the photo-polymerization initiator is more than about 5% by weight, light-absorbance of the photoresist film may be excessively increased so that the polymerization degree of a lower portion of the photoresist film is relatively low.

Examples of the pigment may include an organic pigment and a non-organic pigment. Particularly, examples of the organic pigment may include C.I. pigment yellow 83, C.I. pigment yellow 150, C.I. pigment yellow 138, C.I. pigment yellow 128, C.I. pigment orange 43, C.I. pigment red 177, C.I. pigment red 202, C.I. pigment red 209, C.I. pigment red 254, C.I. pigment red 255, C.I. pigment green 7, C.I. pigment green 36, C.I. pigment blue 15, C.I. pigment blue 15:3, C.I. pigment blue 15:4, C.I. pigment blue 15:6, C.I. pigment violet 23, C.I. pigment black 1, C.I. pigment black 7, etc. Examples of the non-organic pigment may include titanium oxide, titanium black, carbon black, etc. These can be used alone or in a mixture thereof to mix colors.

The anthraquinone-based dye has relatively great heat-resistance and light-resistance. The anthraquinone-based dye may include a compound represented by the following Chemical Formula (1):

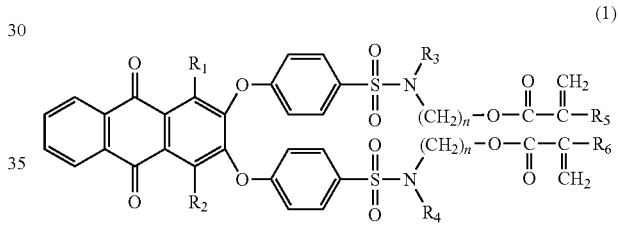

(1)

wherein $R_1$ and $R_2$ independently represent one selected from the group consisting of an amine group, a hydroxyl group and a halogen atom, and $R_3$, $R_4$, $R_5$ and $R_6$ independently represent an alkyl group having 1 to 4 carbon atoms, and n is a natural number.

For example, the anthraquinone-based dye may have a maximum ultraviolet (UV) ray absorbance in a range between about 525 nm and about 535 nm. Furthermore, the anthraquinone-based dye may have a minimum UV ray absorbance in a range between about 495 nm and about 505 nm.

A content of the anthraquinone-based dye may be about 5% to about 50% by weight based on a total weight of the coloring agent. A content of the coloring agent may be about 10% to about 60% by weight based on the total weight of the photoresist composition. When the content of the anthraquinone-based dye is less than about 5% by weight based on the total weight of the coloring agent, light-transmittance of the photoresist film formed from the photoresist composition may not be substantially increased. When the content of the anthraquinone-based dye is more than about 50% by weight, the heat-resistance and the light-resistance of the photoresist film may be reduced. When the content of the coloring agent is less than about 10% by weight based on the total weight of the photoresist composition, a color of the photoresist film may be relatively pale. When the content of the coloring agent is more than about 60% by weight, the light-transmittance of the photoresist film may be reduced.

Examples of the solvent include alcohols such as methanol and ethanol, ethers such as tetrahydrofurane, glycol ethers such as ethylene glycol monomethyl ether and ethylene glycol monoethyl ether, ethylene glycol alkyl ether acetates such as methyl cellosolve acetate and ethyl cellosolve acetate, diethylene glycols such as diethylene glycol monomethyl ether, diethylene glycol monoethyl ether and diethylene glycol dimethyl ether, propylene glycol monoalkyl ethers such as propylene glycol methyl ether, propylene glycol ethyl ether, propylene glycol propyl ether and propylene glycol butyl ether, propylene glycol alkyl ether acetates such as propylene glycol methyl ether acetate, propylene glycol ethyl ether acetate, propylene glycol propyl ether acetate and propylene glycol butyl ether acetate, propylene glycol alkyl ether propionates such as propylene glycol methyl ether propionate, propylene glycol ethyl ether propionate, propylene glycol propyl ether propionate and propylene glycol butyl ether propionate, aromatic compounds such as toluene and xylene, ketones such as methyl ethyl ketone, cyclohexanone and 4-hydroxy 4-methyl 2-pentanone, and ester compounds such as methyl acetate, ethyl acetate, propyl acetate, butyl acetate, ethyl 2-hydroxypropionate, methyl 2-hydroxy 2-methyl propionate, ethyl 2-hydroxy 2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy 3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, etc. These solvents can be used alone or in a mixture thereof. Among the above, glycol ethers, ethylene glycol alkyl ether acetates and diethylene glycols are preferably used in view of solubility and reactivity of the components composing the photoresist composition and a manufacturing condition of a coating layer.

For example, a content of the solvent may be about 20% to about 70% by weight based on the total weight of the photoresist composition. When the content of the solvent is less than about 20% by weight, the viscosity of the photoresist composition may be increased so that the thickness of the photoresist film formed from the photoresist composition is not uniform. When the content of the solvent is more than about 70% by weight, the thickness of the photoresist film may be relatively small.

The photoresist composition may further include an additive, such as a surfactant, a pigment-dispersing agent, an adhesive, etc. A content of the additive may be about 1% to about 3% by weight based on the total weight of the photoresist composition. When the content of the additive is less than about 1% by weight, an adhering characteristic of the photoresist film formed from the photoresist composition may be deteriorated. When the content of the additive is more than about 3% by weight, the photoresist film may be non-uniformly developed.

The surfactant may serve to improve a coating characteristic and/or a developing characteristic of the photoresist composition. Examples of the surfactant may include polyoxyethylene octylphenyl ether, polyoxyethylene nonylphenyl ether, F171 (trade name; manufactured by Dainippon Ink and Chemicals, Inc. of Japan), F172 (trade name; manufactured by Dainippon Ink and Chemicals, Inc. of Japan), F173 (trade name; manufactured by Dainippon Ink and Chemicals, Inc. of Japan), FC430 (trade name; manufactured by Sumitomo 3M, Ltd. of Japan), FC431 (trade name; manufactured by Sumitomo 3M, Ltd. of Japan), KP341 (trade name, manufactured by Shin-Etsu Chemical Co., Ltd. of Japan), etc.

Examples of the pigment-dispersing agent may include a salt and an amide, which are formed by reacting polyalkyleneimine and polyester having a free carboxyl group, polycarboxylic acid ester, unsaturated polyamide, polycarboxylic acid, an amine salt of polycarboxylic acid, an ammonium salt of polycarboxylic acid, an amine salt of polyalkyl carboxylic acid, polysiloxane, polycarboxylic acid ester having a hydroxyl group, derivatives thereof, (meta)acrylic acid/styrene copolymer, (meta)acrylic acid/(meta)acrylic acid ester copolymer, styrene/maleic acid copolymer, polyvinyl alcohol, polyvinyl pyrrolidone, etc. These pigment-dispersing agents can be used alone or in a mixture thereof.

The adhesive may serve to reinforce an adhesion between a substrate and the photoresist film formed from the photoresist composition. Examples of the adhesive may include γ-methacryl propyl trimethoxy silane, vinyl triacetoxy silane, vinyl trimethoxy silane, γ-isocyanate propyl triethoxy silane, γ-glycidoxy propyl trimethoxy silane, β-(3,4-epoxy cyclohexyl)ethyl trimethoxy silane, etc. These adhesives can be used alone or in a mixture thereof.

The photoresist composition may be coated on the substrate through a spraying method, a roll coater method, a spin coating method, etc., and may be then pre-baked to form a photoresist film.

The present invention will be explained more fully hereinafter with reference to an example and a comparative example.

Example 1

About 200 g of propylene glycol methyl ether propionate as a solvent, about 100 g of meta-cresol/formaldehyde novolak resin, of which molecular weight is about 6,000 [weight-average molecular weight (Mw)/number-average molecular weight (Mn)=1.69] as a binder resin, about 10 g of hexa(methoxymethyl)melamine oligomer as a cross-linker, about 3.0 g of benzophenone as a photo-polymerization initiator and about 36 g of C.I. pigment blue 15:6 and about 4 g of a compound represented by following Chemical Formula (2) as a coloring agent were mixed with each other. The mixture was stirred and filtered to prepare a photoresist composition.

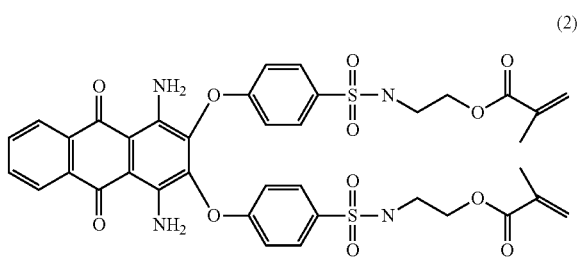

(2)

Comparative Example 1

About 200 g of propylene glycol methyl ether propionate as a solvent, about 100 g of meta-cresol/formaldehyde novolak resin, of which molecular weight is about 6,000 [weight-average molecular weight (Mw)/number-average molecular weight (Mn)=1.69] as a binder resin, about 10 g of hexa(methoxymethyl)melamine oligomer as a cross-linker, about 3.0 g of benzophenone as a photo-polymerization initiator and about 36 g of C.I. pigment blue 15:6 and about 4 g of C.I. pigment violet 23 as a coloring agent were mixed with each other. The mixture was stirred and filtered to prepare a photoresist composition.

Experiment

Evaluation of Characteristics of Photoresist Compositions

Each of the photoresist compositions of Example 1 and Comparative Example 1 was coated on a substrate and was baked to form photoresist films. A heat-resistance, a light-resistance, brightness and a color of each of the photoresist films were measured as follows. The brightness and the color of each of the photoresist films were measured using a reflective spectrophotometer and/or a transmissive spectrophotometer according to a standard calorimetric system of Commission Internationale de l'Eclairage (CIE). Particularly, the brightness, a blue x-coordinate value of a color coordinate system and a blue y-coordinate value of the color coordinate system were measured.

Furthermore, a first color-changing rate $\Delta E1$ of each of the photoresist films were measured after having been heated at a temperature of about 230° C. for about two hours. A second color-changing rate $\Delta E2$ of each of the photoresist films were measured after having been exposed to a xenon lamp for about 200 hours. The first and second color-changing rates $\Delta E1$ and $\Delta E2$ were obtained by calculating values measured according to CIE L-a-b colorimetric system by using the following formula:

$$\Delta E = [(\Delta L)^2 + (\Delta a)^2 + (\Delta b)^2]^{1/2}$$

Thus obtained results are illustrated in the following Table 1.

TABLE 1

| | thickness (μm) | Y | x | y | ΔE1 | ΔE2 |
|---|---|---|---|---|---|---|
| Comparative | 1.29 | 9.73 | 0.138 | 0.096 | 2.62 | 1.16 |
| Example 1 | 0.87 | 15.03 | 0.142 | 0.125 | 1.79 | 0.61 |
| | 0.74 | 17.86 | 0.146 | 0.139 | 2.2 | 0.63 |

TABLE 1-continued

| | thickness (μm) | Y | x | y | ΔE1 | ΔE2 |
|---|---|---|---|---|---|---|
| Example 1 | 1.38 | 13.99 | 0.137 | 0.132 | 3.82 | 1.35 |
| | 0.92 | 20.89 | 0.145 | 0.164 | 2.93 | 1.39 |
| | 0.77 | 24.51 | 0.151 | 0.179 | 2.55 | 1.69 |

FIG. 1 is a graph showing a contrast of each of the photoresist films formed from the photoresist compositions of Example 1 and Comparative Example 1. Each rectangular spot represents a contrast of the photoresist film formed from the photoresist composition of Example 1, and each triangular spot represents a contrast of the photoresist film formed from the photoresist composition of Comparative Example 1. A continuous line represents a linear regression line based on the contrast of the photoresist film formed from the photoresist composition of Example 1. A dotted line represents a linear regression line based on the contrast of the photoresist film formed from the photoresist composition of Comparative Example 1. A vertical axis of the graph corresponds to the contrast value. A horizontal axis of the graph corresponds to the blue y-coordinate value of the color coordinate system.

Referring to Table 1 and FIG. 1, the brightness of the photoresist film formed from the photoresist composition of Example 1 was greater than the brightness of the photoresist film formed from the photoresist composition of Comparative Example 1. Thus, it can be noted that a light-transmittance of the photoresist film formed from the photoresist composition of Example 1 is greater than a light-transmittance of the photoresist film formed from the photoresist composition of Comparative Example 1.

The heat-resistance and the light-resistance of the photoresist film formed from the photoresist composition of Example 1 was smaller than the heat-resistance and the light-resistance of the photoresist film formed from the photoresist composition of Comparative Example 1. However, the heat-resistance and the light-resistance of the photoresist film formed from the photoresist composition of Example 1 are relatively great in comparison with a practically available range of the heat-resistance and the light-resistance.

The contrast of the photoresist film formed from the photoresist composition of Example 1 was greater than the contrast of the photoresist film formed from the photoresist composition of Comparative Example 1. For example, when a value of the horizontal axis of FIG. 2 was about 0.09, a vertical value of the continuous line was about 2243, and a vertical value of the dotted line was about 1591.

Method of Manufacturing a Color Filter Substrate

FIGS. 2 to 6 are cross-sectional views illustrating a method of manufacturing a color filter substrate according to an embodiment of the present invention.

Figure 2:
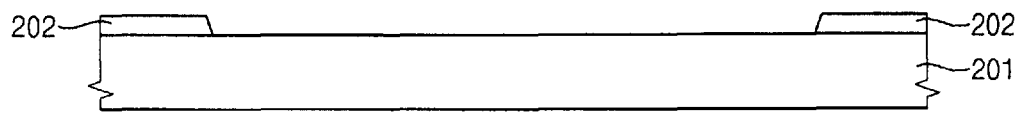
FIGS. 2 to 6 are cross-sectional views illustrating a method of manufacturing a color filter substrate according to an embodiment of the present invention.

Referring to FIG. 2, a light-blocking layer 202 is formed on a base substrate 201. Examples of a material that may be used for the light-blocking layer 202 include chrome, chrome oxide, an organic material containing a black pigment, etc.

Figure 3:

Referring to FIG. 3, a photoresist composition is coated on the base substrate 201 having the light-blocking layer 202 to form a photoresist film 203. The photoresist composition includes a coloring agent, a binder resin, a cross-linker, a photo-polymerization initiator and a solvent. The coloring agent includes an anthraquinone-based dye and a pigment.

For example, the anthraquinone-based dye may have a maximum ultraviolet (UV) ray absorbance in a range between about 525 nm and about 535 nm. Furthermore, the anthraquinone-based dye may include a compound represented by the following Chemical Formula (1):

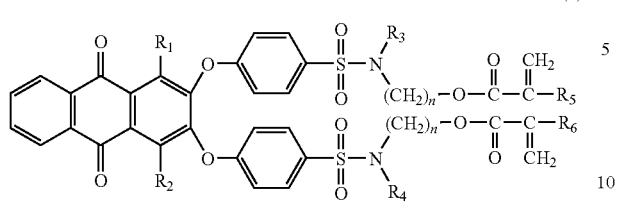

wherein $R_1$ and $R_2$ independently represent one selected from the group consisting of an amine group, a hydroxyl group and a halogen atom, and $R_3$, $R_4$, $R_5$ and $R_6$ independently represent an alkyl group having 1 to 4 carbon atoms, and n is a natural number.

The photoresist composition may be coated on the substrate through a spraying method, a roll coater method, a spin coating method, etc.

The photoresist film 203 is post-baked to remove a portion of the solvent in the photoresist film 203 without decomposing the binder resin. In one example, a thickness of the photoresist film 203 may be no more than about 2 μm after the photoresist film 203 is post-baked.

A mask having a predetermined pattern is positioned on a mask stage of an exposure apparatus, and then the mask is arranged over the photoresist film 203 in an alignment process. An illumination light is irradiated onto the mask for a desirable time so that a portion of the photoresist film 203 is exposed to the light through the mask.

Examples of the light may include a G-line ray, an I-line ray, a krypton fluoride laser, an argon fluoride laser, an electron beam, an X-ray, etc. The I-line ray or the G-line ray may be preferably used as the light. In an exposure process, an exposed portion of the photoresist film 203 may have a solubility substantially different from a solubility of an unexposed portion of the photoresist film 203.

Figure 4:
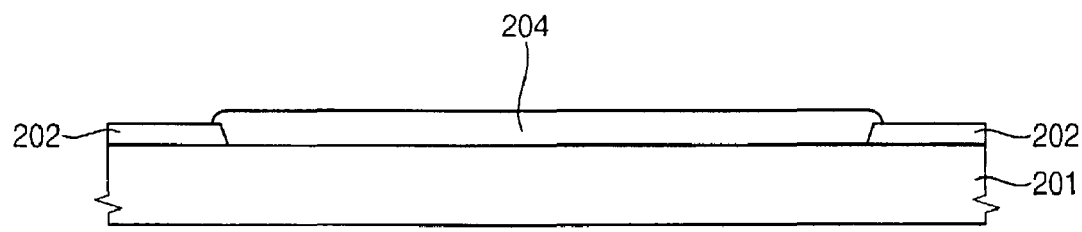

Referring to FIG. 4, the unexposed portion of the photoresist film 203 is removed using a developing solution to form a color filter pattern 204. The color filter pattern 204 may cover a portion of the light-blocking layer 202.

Figure 5:
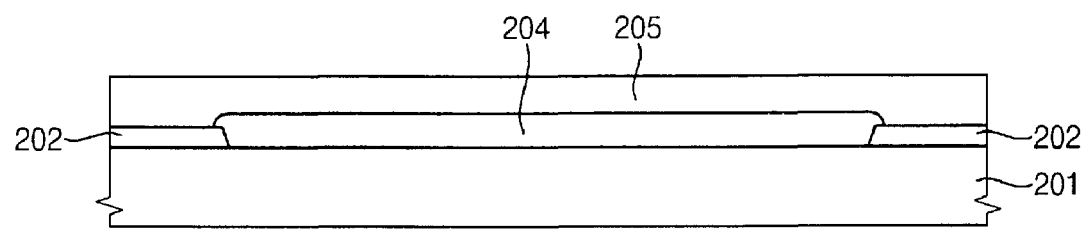

Referring to FIG. 5, a protecting layer 205 is formed on the light-blocking layer 202 and the color filter pattern 204. The protecting layer 205 protects the light-blocking layer 202 and the color filter pattern 204. Examples of a material that may be used for the protecting layer 205 include silicon oxide, silicon nitride, an organic material, etc.

Figure 6:
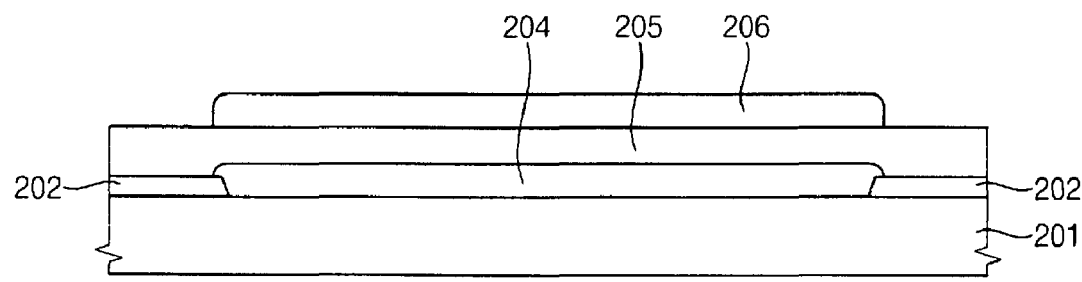

Referring to FIG. 6, a transparent conductive layer (not shown) is formed on the protecting layer 205. Examples of a material that may be used for the transparent conductive layer include indium tin oxide (ITO), indium zinc oxide (IZO), etc. The transparent conductive layer is patterned through a photolithography process to form a common electrode layer 206.

According to the above, a photoresist composition includes a mixture of an anthraquinone-based dye and a pigment as a coloring agent, and a color filter formed from the photoresist composition has a relatively greater light-transmittance. Thus, a contrast of a display apparatus having the color filter may be improved.

Although embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A photoresist composition, comprising:

a coloring agent comprising an anthraquinone-based dye, wherein the anthraquinone-based dye comprises a compound represented by the following Chemical Formula (1):

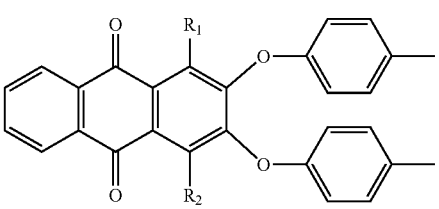

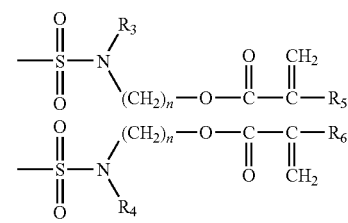

wherein $R_1$ and $R_2$ independently represent one selected from the group consisting of an amine group, a hydroxyl group and a halogen atom, and $R_3$, $R_4$, $R_5$ and $R_6$ independently represent an alkyl group having 1 to 4 carbon atoms, and n is a natural number;

a binder resin;

a cross-linker;

a photo-polymerization initiator; and a solvent.

2. The photoresist composition of claim 1, wherein the anthraquinnone-based dye comprises a compound represented by the following Chemical Formula (2):

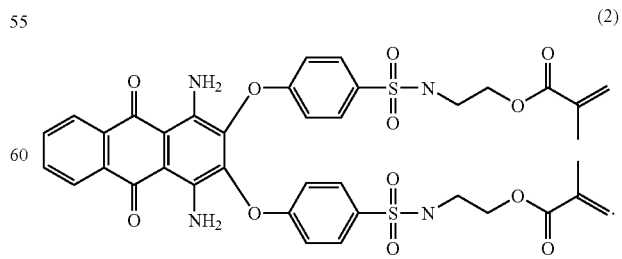

3. The photoresist composition of claim 1, wherein the coloring agent is about 10% to about 60% by weight based on a total weight of the photoresist composition.

4. The photoresist composition of claim 3, wherein the anthraquinone-based dye is about 5% to about 50% by weight based on a total weight of the coloring agent.

5. The photoresist composition of claim 4, wherein the anthraquinone-based dye comprises a maximum ultraviolet (UV) ray absorbance in a range between about 525 nm and about 535 nm.

6. The photoresist composition of claim 1, wherein the binder resin includes at least one selected from the group consisting of a phenol-based polymer and an acryl-based polymer.

7. The photoresist composition of claim 2, wherein the coloring agent further comprises a pigment.

8. The photoresist composition of claim 7, wherein the pigment comprises an organic pigment.

9. The photoresist composition of claim 8, wherein the pigment comprises at least one of C.I. pigment yellow 83, C.I. pigment yellow 150, C.I. pigment yellow 138, C.I. pigment yellow 128, C.I. pigment orange 43, C.I. pigment red 177, C.I. pigment red 202, C.I. pigment red 209, C.I. pigment red 254, C.I. pigment red 255, C.I. pigment green 7, C.I. pigment green 36, C.I. pigment blue 15, C.I. pigment blue 15:3, C.I. pigment blue 15:4, C.I. pigment blue 15:6, C.I. pigment violet 23, C.I. pigment black 1 or C.I. pigment black 7.

10. The photoresist composition of claim 7, further comprising an additive that includes at least one selected from the group consisting of a pigment-dispersing agent, an adhesive and a surfactant.

11. The photoresist composition of claim 10, wherein the additive is about 1% to about 3% by weight based on a total weight of the photoresist composition.

12. A color filter substrate, comprising:
 a substrate;
 a light-blocking layer on the substrate; and
 a photoresist layer comprising an anthraquinone-based dye on the substrate,
 wherein the anthraquinone-based dye comprises a compound represented by the following Chemical Formula (1):

13. The color filter substrate of claim 12, wherein the anthraquinone-based dye comprises a compound represented by the following Chemical Formula (2):

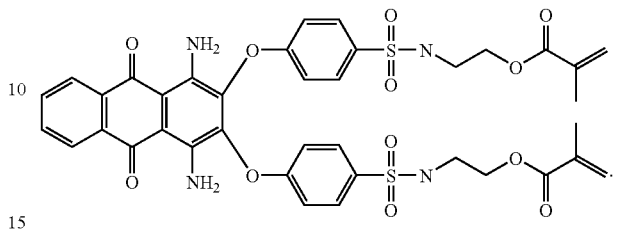

(2)

14. The color filter substrate of claim 12, wherein the anthraquinone-based dye comprises a maximum ultraviolet (UV) ray absorbance in a range between about 525 nm and about 535 nm.

15. The color filter substrate of claim 12, further comprising a protecting layer on the color filter pattern and the light-blocking layer.

16. The color filter substrate of claim 12, further comprising a common electrode layer on the photoresist layer.

17. The color filter substrate of claim 13, wherein the photoresist layer further comprises a pigment.

18. The photoresist composition of claim 17, wherein the pigment comprises at least one of C.I. pigment yellow 83, C.I. pigment yellow 150, C.I. pigment yellow 138, C.I. pigment yellow 128, C.I. pigment orange 43, C.I. pigment red 177, C.I. pigment red 202, C.I. pigment red 209, C.I. pigment red 254, C.I. pigment red 255, C.I. pigment green 7, C.I. pigment green 36, C.I. pigment blue 15, C.I. pigment blue 15:3, C.I. pigment blue 15:4, C.I. pigment blue 15:6, C.I. pigment violet 23, C.I. pigment black 1, C.I. pigment black 7, titanium oxide, titanium black or carbon black.

19. The color filter substrate of claim 12, wherein the photoresist layer further comprises
 a binder resin;
 a cross-linker;

(1)

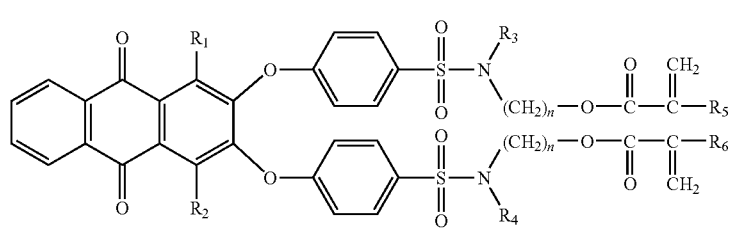

wherein $R_1$ and $R_2$ independently represent one selected from the group consisting of an amine group, a hydroxyl group and a halogen atom, and $R_3$, $R_4$, $R_5$ and $R_6$ independently represent an alkyl group having 1 to 4 carbon atoms, and n is a natural number.

a photo-polymerization initiator; and
a solvent.

* * * * *